United States Patent
Mori et al.

(10) Patent No.: US 11,496,162 B2
(45) Date of Patent: Nov. 8, 2022

(54) RADIO-FREQUENCY CIRCUIT AND COMMUNICATION DEVICE

(71) Applicant: Murata Manufacturing Co., Ltd., Nagaokakyo (JP)

(72) Inventors: Hirotsugu Mori, Nagaokakyo (JP); Hidenori Obiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 90 days.

(21) Appl. No.: 17/012,789

(22) Filed: Sep. 4, 2020

(65) Prior Publication Data
US 2021/0075448 A1   Mar. 11, 2021

(30) Foreign Application Priority Data
Sep. 10, 2019   (JP) .............................. JP2019-164331

(51) Int. Cl.
| H04B 1/00 | (2006.01) |
| H03F 3/19 | (2006.01) |
| H03H 9/72 | (2006.01) |

(52) U.S. Cl.
CPC ............ H04B 1/0057 (2013.01); H03F 3/19 (2013.01); H03H 9/725 (2013.01); H04B 1/006 (2013.01);
(Continued)

(58) Field of Classification Search
CPC ......... H04B 1/0057; H04B 1/006; H03F 3/19; H03F 2200/111; H03F 2200/451; H03H 9/725
See application file for complete search history.

(56) References Cited

U.S. PATENT DOCUMENTS

| 9,391,666 | B1 | 7/2016 | Handtmann et al. |
| 2008/0227409 | A1* | 9/2008 | Chang ................... H04B 1/525 |
| | | | 455/78 |

(Continued)

FOREIGN PATENT DOCUMENTS

| JP | 2017-017691 A | 1/2017 |
| WO | 2016/208670 A1 | 12/2016 |
| WO | 2019/235181 A1 | 12/2019 |

OTHER PUBLICATIONS

ZTE Corporation, Discussion on LTE anchor agnostic approach for EN-DC, 3GPP TSG-RAN WG4 Meeting #90bis, Apr. 8-12, 2019, pp. 1-4, R4-1903152, ZTE Corporation, Xian, China.

*Primary Examiner* — Dinh T Le
(74) *Attorney, Agent, or Firm* — Pearne & Gordon LLP

(57) ABSTRACT

A radio-frequency circuit is capable of simultaneously transmitting a radio-frequency signal of a middle high band group (MHB) including B1 and B3, and a radio-frequency signal of a ultra-high band group (UHB) including n77, and includes: a first transfer circuit that transfers the MHB radio-frequency signal and a radio-frequency signal of a low band group (LB); and a second transfer circuit that transfers the UHB radio-frequency signal. The first transfer circuit includes: a power amplifier for B1 signals; a diplexer that demultiplexes and/or multiplexes the MHB radio-frequency signal and the LB radio-frequency signal; a transmission filter that is connected to the power amplifier and has, as a passband, a transmission band of B1; and a band-elimination filter that is disposed between the diplexer and the transmission filter, and has, as an attenuation band, a transmission band of n77. The second transfer circuit includes a power amplifier for n77 signals.

14 Claims, 5 Drawing Sheets

(52) U.S. Cl.
 CPC .. *H03F 2200/111* (2013.01); *H03F 2200/451* (2013.01)

(56) References Cited

U.S. PATENT DOCUMENTS

| | | | | |
|---|---|---|---|---|
| 2011/0292844 | A1* | 12/2011 | Kwun | H04B 1/0057 370/278 |
| 2015/0236798 | A1* | 8/2015 | Nobbe | H03F 3/21 370/278 |
| 2016/0380652 | A1 | 12/2016 | Anthony et al. | |
| 2016/0381649 | A1* | 12/2016 | Anthony | H03F 3/245 455/127.2 |
| 2018/0109243 | A1 | 4/2018 | Takamine | |

\* cited by examiner

RADIO-FREQUENCY CIRCUIT AND COMMUNICATION DEVICE

CROSS REFERENCE TO RELATED APPLICATION

The present application is based on and claims priority of Japanese Patent Application No. 2019-164331 filed on Sep. 10, 2019. The entire disclosure of the above-identified application, including the specification, drawings and claims is incorporated herein by reference in its entirety.

TECHNICAL FIELD

The present disclosure relates to a radio-frequency circuit and a communication device.

BACKGROUND

A method of simultaneously using different frequency bands (communication bands) should be applied to multi-band/multimode-compatible radio-frequency front-end modules.

Japanese Unexamined Patent Application Publication No. 2017-17691 (PTL 1), in its FIG. 2B, discloses a circuit configuration of an electronic system (a radio-frequency front-end module) having a first transmission circuit and a second transmission circuit. Specifically, the first transmission circuit includes a first power amplifier that amplifies a radio-frequency signal of one frequency domain (a first frequency band group), a first antenna switch, a first band selector switch disposed on a first signal path connecting the first power amplifier and the first antenna switch, and first filters (duplexers) connected to the first band selector switch. The second transmission circuit includes a second power amplifier that amplifies a radio-frequency signal of another frequency domain (a second frequency band group), a second antenna switch, a second band selector switch disposed on a second signal path connecting the second power amplifier and the second antenna switch, and second filters (duplexers) connected to the second band selector switch. This enables simultaneous transmission of a first radio-frequency transmission signal output from the first transmission circuit and a second radio-frequency transmission signal output from the second transmission circuit.

BRIEF SUMMARY

The problem, however, is that when the simultaneous transmission of the first radio-frequency transmission signal and the second radio-frequency transmission signal is performed, the second radio-frequency transmission signal output from the second power amplifier is superimposed on the first radio-frequency transmission signal that is output from the first power amplifier and is propagating in the first signal path. As a result, intermodulation distortion is generated between the first radio-frequency transmission signal and the second radio-frequency transmission signal, and this causes radio-frequency signal quality to deteriorate.

In view of this, the present disclosure is to provide a radio-frequency circuit and a communication device which reduce the generation of intermodulation distortion when a plurality of radio-frequency signals having different frequencies are being simultaneously transmitted.

A radio-frequency circuit according to one aspect of the present disclosure is capable of simultaneously transmitting (i) a radio-frequency signal of a first frequency band group including a first communication band and a second communication band and (ii) a radio-frequency signal of a second frequency band group including a third communication band and having a frequency range that does not overlap a frequency range of the first frequency band group. The radio-frequency circuit includes: a first transfer circuit configured to transfer the radio-frequency signal of the first frequency band group and a radio-frequency signal of a third frequency band group having a frequency range that does not overlap the frequency range of the first frequency band group; and a second transfer circuit configured to transfer the radio-frequency signal of the second frequency band group. The first transfer circuit includes: a first antenna connector terminal; a first transmission power amplifier configured to amplify a radio-frequency signal of the first communication band; a first multiplexer that is connected to the first antenna connector terminal and configured to demultiplex and/or multiplex the radio-frequency signal of the first frequency band group and the radio-frequency signal of the third frequency band group; a first transmission filter that is connected to an output terminal of the first transmission power amplifier and has, as a passband, a transmission band of the first communication band; and a first band-elimination filter that is disposed between the first multiplexer and the first transmission filter, and has, as an attenuation band, a transmission band of the third communication band. The second transfer circuit includes a second transmission power amplifier configured to amplify a radio-frequency signal of the third communication band.

The present disclosure can provide a radio-frequency circuit and a communication device which reduce the generation of intermodulation distortion when a plurality of radio-frequency signals having different frequencies are being simultaneously transmitted.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION OF EMBODIMENTS

Figure 1A:
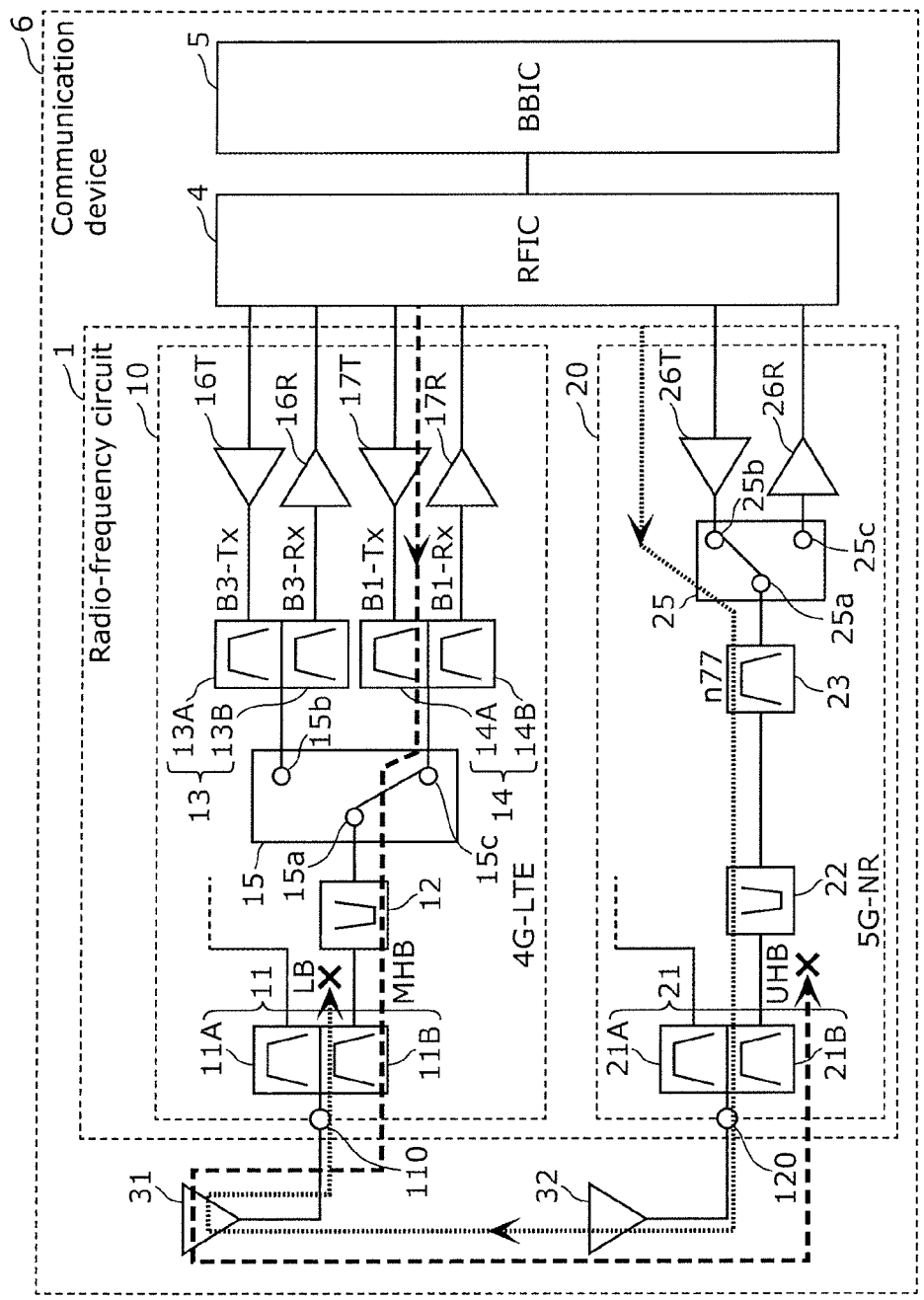
FIG. 1A is a circuit configuration diagram of a radio-frequency circuit and a communication device according to an embodiment.

Hereinafter, exemplary embodiments of the present disclosure will be described in detail with reference to the drawings. It should be noted that each of the subsequently described exemplary embodiments show a generic or specific example. The numerical values, shapes, materials, elements, the arrangement and connection of the elements, etc. indicated in the following exemplary embodiments are mere examples, and therefore are not intended to limit the present disclosure. Among the elements described in the following exemplary embodiments, elements not recited in any one of the independent claims are described as optional elements. In addition, the sizes of the elements and the ratio of the sizes illustrated in the drawings are not necessarily accurate.

EMBODIMENT

1. Configuration of Radio-Frequency Circuit 1 and Communication Device 6

FIG. 1A is a circuit configuration diagram of radio-frequency circuit 1 and communication device 6 according to the embodiment. As illustrated in the figure, communication device 6 includes radio-frequency circuit 1, antennas 31 and 32, RF signal processing circuit (RFIC) 4, and baseband signal processing circuit (BBIC) 5.

Radio-frequency circuit 1 includes transfer circuit 10 and transfer circuit 20.

Transfer circuit 10 is one example of the first transfer circuit and transfers a radio-frequency signal of a first frequency band group and a radio-frequency signal of a third frequency band group having a frequency range that does not overlap a frequency range of the first frequency band group.

Transfer circuit 20 is one example of the second transfer circuit and transfers a radio-frequency signal of a second frequency band group having a frequency range that does not overlap the frequency range of the first frequency band group.

Each of the first frequency band group and the third frequency band group is, for example, a different one of a low band group, a middle high band group, and an ultra-high band group.

The low band group is a frequency band group including a plurality of communication bands for the fourth generation mobile communication system (4G) and the fifth generation mobile communication system (5G), and has a frequency range with the upper limit of 1 GHz, for example. The low band group includes communication bands such as 4G-long term evolution (LTE: also referred to as Evolved-Universal Terrestrial Radio Access (E-UTRA)) Band 5 (a transmission band from 824 MHz to 849 MHz and a reception band from 869 MHz to 894 MHz), Band 8 (a transmission band from 880 MHz to 915 MHz and a reception band from 925 MHz to 960 MHz), and Band 28 (a transmission band from 703 MHz to 748 MHz and a reception band from 753 MHz to 803 MHz). It should be noted that 4G-LTE Band X is hereinafter sometimes simply referred to as "BX".

The middle high band group is a frequency band group including a plurality of communication bands for 4G and 5G, is located on a high-frequency side of the low band group, and has a frequency range from 1.5 GHz to 2.8 GHz, for example. The middle high band group includes, for example, 4G-LTE B1 (a transmission band from 1920 MHz to 1980 MHz and a reception band from 2110 MHz to 2170 MHz), B3 (a transmission band from 1710 MHz to 1785 MHz and a reception band from 1805 MHz to 1880 MHz), B66 (a transmission band from 1710 MHz to 1780 MHz and a reception band from 2110 MHz to 2200 MHz), B7 (a transmission band from 2500 MHz to 2570 MHz and a reception band from 2620 MHz to 2690 MHz).

The ultra-high band group is a frequency band group including a plurality of communication bands for 4G and 5G, is located on a high-frequency side of the middle high band group, and has a frequency range with the lower limit of 3 GHz, for example. The ultra-high band group includes communication bands such as 5G-new radio (NR) n77 (a frequency band from 3300 MHz to 4200 MHz), n78 (a frequency band from 3300 MHz to 3800 MHz), and n79 (a frequency band from 4400 MHz to 5000 MHz). It should be noted that 5G-NR nY is hereinafter sometimes simply referred to as "nY".

In the present embodiment, the middle high band group is applied as the first frequency band group, the ultra-high band group is applied as the second frequency band group, and the low band group is applied as the third frequency band group.

Transfer circuit 10 includes antenna connector terminal 110, diplexer 11, band-elimination filter 12, duplexers 13 and 14, switch 15, power amplifiers 16T and 17T, and low-noise amplifiers 16R and 17R.

Antenna connector terminal 110 is one example of the first antenna connector terminal, and is connected to antenna 31 (the first antenna).

Power amplifier 17T is one example of the first transmission power amplifier and amplifies a transmission signal of, for example, B1 (the first communication band). Power amplifier 16T amplifies a transmission signal of, for example, B3 (the second communication band).

Low-noise amplifier 17R amplifies a reception signal of, for example, B1 (the first communication band). Low-noise amplifier 16R amplifies a reception signal of, for example, B3 (the second communication band).

Diplexer 11 is one example of the first multiplexer, is connected to antenna connector terminal 110, and demultiplexes and/or multiplexes a radio-frequency signal of the middle high band group (MHB) and a radio-frequency signal of the low band group (LB). Diplexer 11 includes filters 11A and 11B. Filter 11A is a filter having, as a passband, the frequency range of the low band group (LB), and filter 11B is a filter having, as a passband, the frequency range of the middle high band group (MHB). One terminal of filter 11A and one terminal of filter 11B are commonly connected to antenna connector terminal 110.

Duplexer 14 is one example of the first duplexer and includes transmission filter 14A and reception filter 14B. Transmission filter 14A is one example of the first transmission filter and is a filter having, as a passband, the transmission band of B1 (the first communication band). Transmission filter 14A has an input terminal connected to the output terminal of power amplifier 17T. Reception filter 14B is one example of the first reception filter and is a filter having, as a passband, the reception band of B1 (the first communication band). Reception filter 14B has an output terminal connected to the input terminal of low-noise amplifier 17R. The output terminal of transmission filter 14A and the input terminal of reception filter 14B are commonly connected to selector terminal 15c of switch 15.

Duplexer 13 is one example of the second duplexer and includes transmission filter 13A and reception filter 13B. Transmission filter 13A is one example of the second transmission filter and is a filter having, as a passband, the transmission band of B3 (the second communication band). The input terminal of transmission filter 13A is connected to the output terminal of power amplifier 16T. Reception filter 13B is one example of the second reception filter and is a filter having, as a passband, the reception band of B3 (the second communication band). The output terminal of reception filter 13B is connected to the input terminal of low-noise amplifier 16R. The output terminal of transmission filter 13A and the input terminal of reception filter 13B are commonly connected to selector terminal 15b of switch 15.

According to duplexers 13 and 14, transfer circuit 10 performs transmission and reception of B1 and B3 radio-frequency signals, using a frequency division duplex (FDD) scheme.

Band-elimination filter 12 is one example of the first band-elimination filter, is disposed between diplexer 11 and duplexers 13 and 14, and has, as an attenuation band, a band of n77 (the third communication band) in the ultra-high band group for radio-frequency signals transferred by transfer circuit 20.

Switch 15 is one example of the first switch, is disposed between band-elimination filter 12 and duplexers 13 and 14, and switches connection of band-elimination filter 12 between duplexer 13 and duplexer 14. Specifically, switch 15 is, for example, a single pole double throw (SPDT) switch circuit including common terminal 15a and selector terminals 15b and 15c. Common terminal 15a is connected to one terminal of band-elimination filter 12, selector terminal 15b is connected to the common terminal of duplexer 13 (i.e., the output terminal of transmission filter 13A and the input terminal of reception filter 13B), and selector terminal 15c is connected to the common terminal of duplexer 14 (i.e., the output terminal of transmission filter 14A and the input terminal of reception filter 14B).

According to the configuration of transfer circuit 10, when common terminal 15a is connected to selector terminal 15b, a transmission signal of B3 (the second communication band) is transmitted and a reception signal of B3 (the second communication band) is received. When common terminal 15a is connected to selector terminal 15c, a transmission signal of B1 (the first communication band) is transmitted and a reception signal of B1 (the first communication band) is received.

Transfer circuit 20 includes antenna connector terminal 120, diplexer 21, band-elimination filter 22, filter 23, switch 25, power amplifier 26T, and low-noise amplifier 26R.

Antenna connector terminal 120 is one example of the second antenna connector terminal, and is connected to antenna 32 (the second antenna).

Power amplifier 26T is one example of the second transmission power amplifier and amplifies a radio-frequency transmission signal of, for example, n77 (the third communication band). Low-noise amplifier 26R amplifies a radio-frequency reception signal of, for example, n77 (the third communication band).

Diplexer 21 is one example of the second multiplexer, is connected to antenna connector terminal 120, and demultiplexes and/or multiplexes a radio-frequency signal of the ultra-high band group (UHB) and a radio-frequency signal of another frequency band group (fourth frequency band group). Diplexer 21 includes filters 21A and 21B. Filter 21A is a filter having, as a passband, a frequency range of the other frequency band group, and filter 21B is a filter having, as a passband, a frequency range of the ultra-high band group (UHB). One terminal of filter 21A and one terminal of filter 21B are commonly connected to antenna connector terminal 120.

Filter 23 is one example of the third transmission filter and is a filter that passes a transmission signal of n77 (the third communication band), which is output from power amplifier 26T. One terminal of filter 23 is connected to common terminal 25a of switch 25 and the other terminal of filter 23 is connected to one terminal of band-elimination filter 22. Note that filter is also capable of passing a reception signal of n77 (the third communication band) and is a filter compatible with a time division duplex (TDD) scheme.

Switch 25 is disposed between filter 23 and power amplifier 26T and low-noise amplifier 26R, and switches connection of filter 23 between power amplifier 26T and low-noise amplifier 26R. Specifically, switch 25 is, for example, an SPDT switch circuit including common terminal 25a and selector terminals 25b and 25c. Common terminal 25a is connected to one terminal of filter 23, selector terminal 25b is connected to the output terminal of power amplifier 26T, and selector terminal 25c is connected to the input terminal of low-noise amplifier 26R.

Transfer circuit 20 performs, using the TDD scheme, transmission and reception of radio-frequency signals of n77 (the third communication band) through the switching operation performed by switch 25.

Band-elimination filter 22 is one example of the second band-elimination filter, is disposed between diplexer 21 and filter 23, and has, as an attenuation band, the transmission band of B1 (the first communication band) in the middle high band group for radio-frequency signals transferred by transfer circuit 10.

According to the aforementioned configuration, radio-frequency circuit 1 is capable of simultaneously transmitting a radio-frequency signal of the middle high band group including B1 and B3, and a radio-frequency signal of the ultra-high band group including n77.

Band-elimination filters 12 and 22 may be each an acoustic wave filter including an acoustic wave resonator. The acoustic wave resonator uses, for example, surface acoustic waves (SAWs) or bulk acoustic waves (BAWs). Alternatively, band-elimination filters 12 and 22 may be each an LC filter including at least one of an inductor or a capacitor. Furthermore, band-elimination filters 12 and 22 may be each a phase shifter and required to be an element with which the impedance of its attenuation band is either in open circuit condition or in short circuit condition.

Band-elimination filter 12 may have a configuration capable of changing its attenuation band according to a transmission signal output from transfer circuit 20. For example, band-elimination filter 12 may switch the attenuation band between n77 and n78. Band-elimination filter 22 may have a configuration capable of changing its attenuation band according to a transmission signal output from transfer circuit 10. For example, band-elimination filter 22 may switch the attenuation band between B1 and B3.

Power amplifiers 16T, 17T, and 26T as well as low-noise amplifiers 16R, 17R, and 26R each include, for example, a Si-based complementary metal oxide semiconductor (CMOS), or comprise GaAs and include a field effect transistor (FET) or a hetero bipolar transistor (HBT).

In transfer circuit 10, low-noise amplifiers 16R, 17R, and switch 15 may be formed in a first semiconductor integrated circuit (IC). Stated differently, low-noise amplifiers 16R, 17R, and switch 15 may be formed on the same IC substrate and integrated in a single chip. In transfer circuit 20, low-noise amplifier 26R and switch 25 may be formed in a second semiconductor IC. Stated differently, low-noise amplifier 26R and switch 25 may be formed on the same IC substrate and integrated in a single chip. The first semiconductor IC and the second semiconductor IC each include, for example, a CMOS. Specifically, the first semiconductor IC and the second semiconductor IC are each formed by a silicon-on-insulator (SOI) process. This enables manufacturing of semiconductor ICs with low cost. Note that the first semiconductor IC and the second semiconductor IC may each comprise at least one of GaAs, SiGe, or GaN. This enables output of a radio-frequency signal having high-quality amplification performance and noise performance.

The first semiconductor IC may further include power amplifiers 16T and 17T. The second semiconductor IC may further include power amplifier 26T.

Low-noise amplifiers 16R, 17R, power amplifiers 16T, 17T, switch 15, diplexer 11, band-elimination filter 12, and duplexers 13 and 14, which are included in transfer circuit 10, may be formed in a single mounting substrate.

Low-noise amplifier 26R, power amplifier 26T, switch 25, diplexer 21, band-elimination filter 22, and filter 23, which are included in transfer circuit 20, may be formed in a single mounting substrate.

Transfer circuits 10 and 20 may be mounted on a single mounting substrate. This achieves miniaturization of radio-frequency circuit 1.

Note that diplexers 11 and 21 as well as band-elimination filters 12 and 22 may each include an inductor and a capacitor formed in a mounting substrate, or include a chip inductor and a chip capacitor mounted on a mounting substrate.

Diplexers 11 and 21 may be switches.

Figure 1B:
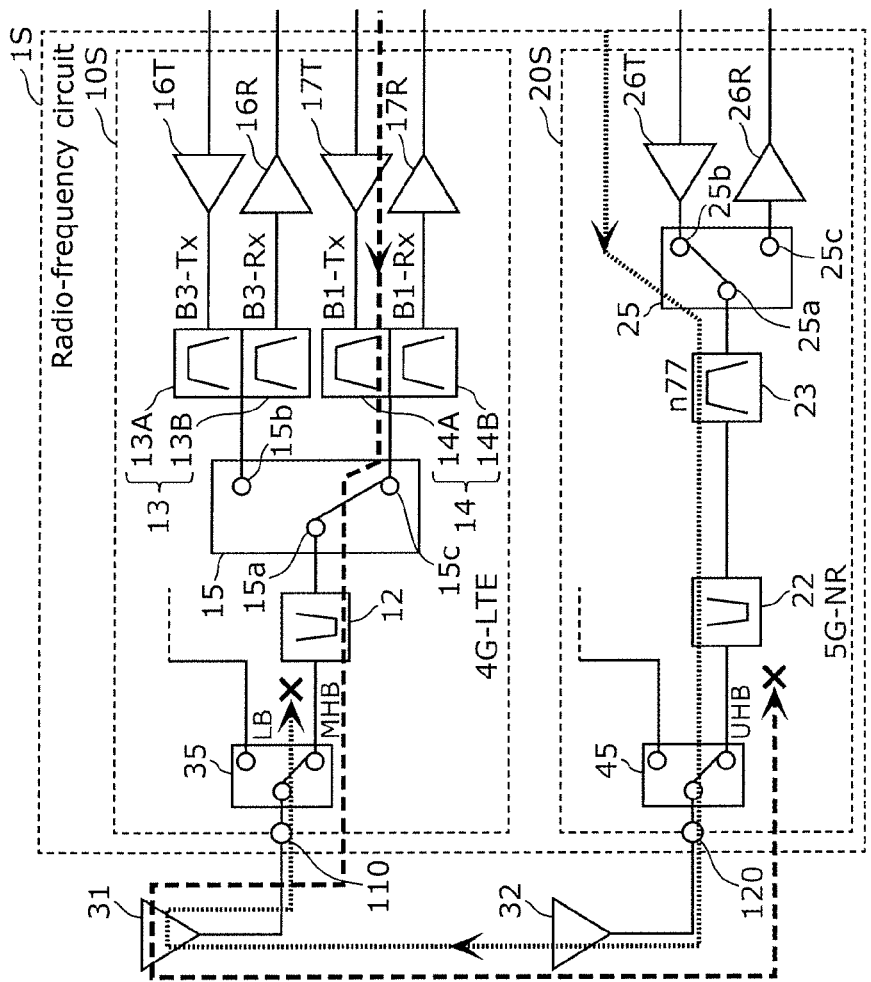
FIG. 1B is a circuit configuration diagram of a radio-frequency circuit according to Variation 1 of the embodiment.

FIG. 1B is a circuit configuration diagram of radio-frequency circuit 1S according to Variation 1 of the embodiment of FIG. 1A. Radio-frequency circuit 1S illustrated in the figure includes transfer circuits 10S and 20S. Radio-frequency circuit 1S includes switches 35 and 45 instead of diplexers 11 and 21, respectively, which is the only difference between radio-frequency circuit 1S and radio-frequency circuit 1.

Switch 35 includes a common terminal and two selector terminals. The common terminal of switch 35 is connected to antenna connector terminal 110, one of the two selector terminals of switch 35 is connected to band-elimination filter 12, and the other of the selector terminals is connected to a signal path for transferring an LB radio-frequency signal. In other words, in radio-frequency circuit 1S according to Variation 1, switch 35 is a first multiplexer that is connected to antenna connector terminal 110 and demultiplexes and/or multiplexes an MHB radio-frequency signal and an LB radio-frequency signal.

Switch 45 includes a common terminal and two selector terminals. The common terminal of switch 45 is connected to antenna connector terminal 120, one of the two selector terminals of switch 45 is connected to band-elimination filter 22, and the other of the selector terminals is connected to a signal path for transferring a radio-frequency signal of another frequency band group. In other words, in radio-frequency circuit 1S according to Variation 1, switch 45 is a second multiplexer that is connected to antenna connector terminal 120 and demultiplexes and/or multiplexes a UHB radio-frequency signal and a radio-frequency signal of the other frequency band group different from the UHB.

Returning back to FIG. 1A, the configuration of radio-frequency circuit 1 and communication device 6 will be described.

Transfer circuit 10 may perform transmission and reception of radio-frequency signals of B1 (the first communication band), using the TDD scheme. In this case, a TDD filter and a switch are disposed instead of duplexer 14. Transfer circuit 10 may perform transmission and reception of radio-frequency signals of B3 (the second communication band), using the TDD scheme. In this case, a TDD filter and a switch are disposed instead of duplexer 13.

Transfer circuit 20 may perform transmission and reception of radio-frequency signals of the third communication band, using the FDD scheme. In this case, a duplexer including a transmission filter and a reception filter is disposed instead of filter 23 and switch 25.

Note that transfer circuits 10 and 20 may be circuits capable of performing only transmission of radio-frequency signals. When transfer circuit 10 performs only the transmission of radio-frequency signals, low-noise amplifies 16R and 17R, reception filters 13B and 14B are not necessary. When transfer circuit 20 performs only the transmission of radio-frequency signals, low-noise amplifier 26R and switch 25 are not necessary. This enables simultaneous transmission of a B1 or B3 radio-frequency signal and an n77 radio-frequency signal.

The communication bands of a radio-frequency signal transferred by transfer circuit 10 are not limited to B1 and B3. The communication band of a radio-frequency signal transferred by transfer circuit 20 is not limited to n77. The communication bands of radio-frequency signals transferred by transfer circuits 10 and 20 need to satisfy a relationship such that a frequency of intermodulation distortion between the second transmission signal output by transfer circuit 20 and the first transmission signal transferred in transfer circuit 10 is included either in the frequency range of the communication band of the first transmission signal or in the reception band of transfer circuit 10.

The number of communication bands for radio-frequency signals transferred by transfer circuit 10 may be at least three and the number of communication bands for radio-frequency signals transferred by transfer circuit 20 may be at least two.

Antenna 31 is one example of the first antenna, is connected to antenna connector terminal 110, and transmits and receives radio-frequency signals. Antenna 32 is one example of the second antenna, is connected to antenna connector terminal 120, and transmits and receives radio-frequency signals.

RFIC 4 is an RF signal processing circuit that processes radio-frequency signals. Specifically, RFIC 4 performs, by upconversion, etc., signal processing on a transmission signal input from BBIC 5, and outputs the radio-frequency signal generated through the signal processing to transfer circuits 10 and 20. RFIC 4 includes a controller that switches the connection states of switches 15 and 25 based on a combination of the communication bands of the radio-frequency signals transferred in radio-frequency circuit 1.

BBIC 5 is a circuit that performs signal processing using an intermediate frequency band including a frequency lower than a radio-frequency signal propagating in transfer circuits 10 and 20. The signal processed by BBIC 5 is, for example, used as an image signal for image display or as a sound signal for conversation via a speaker.

RFIC 4 and BBIC 5 may be signal processing circuits that process radio-frequency signals, and BBIC 5 may include the aforementioned controller.

Note that BBIC 5 is not an essential element of communication device 6 according to this embodiment.

Figure 2:
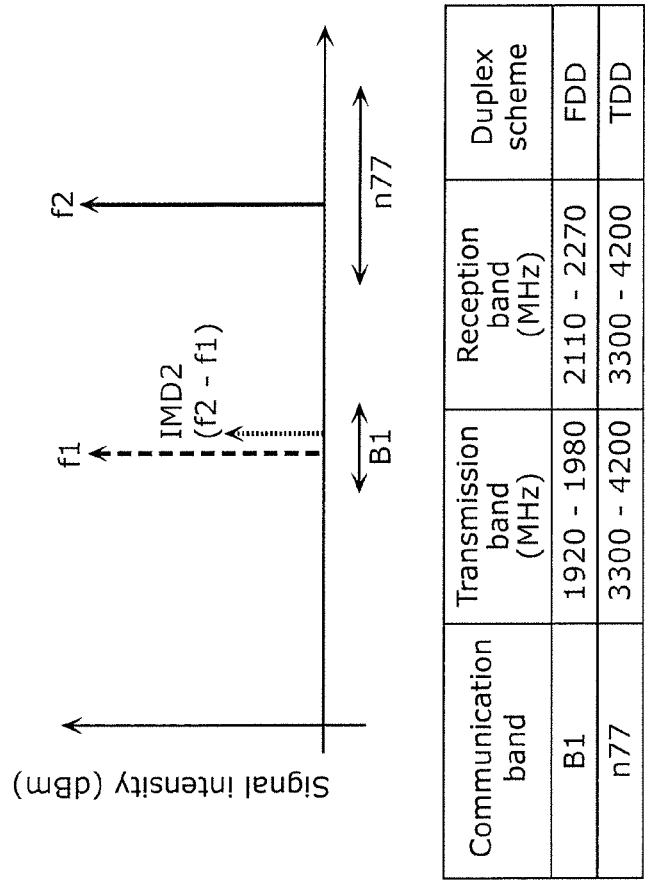
FIG. 2 is an outline diagram representing an example of a frequency relationship between a transmission signal output from a first transfer circuit, a transmission signal output from a second transfer circuit, and intermodulation distortion.

FIG. 2 is an outline diagram representing an example of a frequency relationship between a transmission signal output from transfer circuit 10, a transmission signal output from transfer circuit 20, and intermodulation distortion. The figure indicates the generation of second-order intermodulation distortion (f2−f1) in the case where, in radio-frequency circuit 1, transfer circuit 10 transfers a B1 transmission signal (the first frequency f1), and at the same time, transfer circuit 20 transfers an n77 transmission signal (the second frequency f2) (LTE-NR dual connectivity: Evolved-Universal Terrestrial Radio Access Network New Radio-Dual Connectivity (EN-DC)).

In radio-frequency circuit 1, the n77 transmission signal (the second frequency f2) output from transfer circuit 20 flows into transfer circuit 10 via antenna connector terminal 120, antenna 32, antenna 31, and antenna connector terminal 110. Second-order intermodulation distortion IMD2 (a frequency: f2−f1) is generated in transfer circuit 10 by the n77 transmission signal (the second frequency f2) that flows into transfer circuit 10 and the B1 transmission signal (the first frequency f1) output from power amplifier 17T in transfer circuit 10 (also referred to as "reverse intermodulation distortion (IMD)2" since the second-order intermodulation distortion is caused by the n77 transmission signal reversely flowing from antenna connector terminal 110). Due to the frequency relationship between the B1 transmission signal (the first frequency f1) and the n77 transmission signal (the second frequency f2), the frequency of the second-order intermodulation distortion IMD2 is included in the frequency range of B1. In other words, owing to a frequency, which is twice the first frequency f1 included in B1, being included in the frequency range of n77, the frequency of the second-order intermodulation distortion IMD2 is included in the frequency range of B1.

It is assumed that for this reason, an unwanted wave which is the second-order intermodulation distortion IMD2 is superimposed on the B1 transmission signal output from radio-frequency circuit 1, and in-band spurious emission specification in the third generation partnership project (3GPP) is not satisfied. Moreover, it is assumed that the unwanted wave generated in the reception band of B1 causes deterioration of reception sensitivity to B1 signals.

However, with radio-frequency circuit 1 according to this embodiment, it is possible, with band-elimination filter 12 disposed between diplexer 11 and transmission filter 14A, to inhibit the n77 transmission signal output from transfer circuit 20 from reaching transmission filter 14A via antenna connector terminal 110. This can avoid the in-band spurious emission specification in 3GPP being unsatisfied due to the generation, in the transmission band of B1, of an unwanted wave that is intermodulation distortion IMD2 (reverse IMD2) between the n77 transmission signal that flows from transfer circuit 20 via antenna connector terminal 110 and the B1 transmission signal transferred in transfer circuit 10. Moreover, it is possible to avoid the deterioration of reception sensitivity to B1 signals, which is caused by the generation of the unwanted wave in the reception band of B1.

Moreover, it is possible to block the n77 transmission signal that flows into transfer circuit 10 via antenna connector terminal 110, before the n77 transmission signal reaches transmission filter 14A, as compared with the case where band-elimination filter 12 is disposed between transmission filter 14A and power amplifier 17T. For this reason, it is possible to reduce an increase, due to non-linear behavior exhibited by transmission filter 14A, in intermodulation distortion IMD2 between the n77 transmission signal and the B1 transmission signal. This in turn makes it possible to effectively reduce the in-band spurious emission in 3GPP or the deterioration of reception sensitivity to B1 signals.

In radio-frequency circuit 1 according to this embodiment, band-elimination filter 12 is disposed between diplexer 11 and switch 15. Stated differently, switch 15 is disposed between band-elimination filter 12 and transmission filters 13A and 14A.

This can block the B1 transmission signal flowing into transfer circuit 10 via antenna connector terminal 110, before the B1 transmission signal reaches switch 15. It is therefore possible to reduce an increase, due to non-linear behavior exhibited by switch 15, in intermodulation distortion IMD2 between the B1 transmission signal and the n77 transmission signal. Accordingly, it is possible to effectively reduce the in-band spurious emission in 3GPP or the deterioration of reception sensitivity to B1 signals.

According to radio-frequency circuit 1 according to this embodiment, it is possible, with band-elimination filter 22 disposed between diplexer 21 and filter 23, to inhibit the B1 transmission signal, which is output from transfer circuit 10, from reaching filter 23 via antenna connector terminal 120. This can avoid the in-band spurious emission specification in 3GPP being unsatisfied due to the generation, by non-linear behavior exhibited by transfer circuit 20, of a harmonic of the B1 transmission signal that is output from transfer circuit 10, owing to the B1 transmission signal being transferred via antenna 32. Moreover, it is possible to avoid the deterioration of reception sensitivity to n77 signals, which is caused by the generation of the harmonic in the reception band of n77.

Moreover, it is possible to block the B1 transmission signal that flows into transfer circuit 20 via antenna connector terminal 120, before the B1 transmission signal reaches filter 23, as compared with the case where band-elimination filter 22 is disposed between filter 23 and power amplifier 26T. It is therefore possible to reduce an increase of the B1 harmonic due to non-linear behavior exhibited by transfer circuit 20. Accordingly, it is possible to effectively reduce the in-band spurious emission in 3GPP or the deterioration of reception sensitivity to n77 signals.

It should be noted that band-elimination filter 22 does not need to be disposed in radio-frequency circuit 1 according to this embodiment.

As described above, radio-frequency circuit 1 and communication device 6 according to this embodiment are applied to communication systems such as 4G and 5G, and are typically applied to systems for performing simultaneous transmission of a 4G-LTE radio-frequency signal and a 5G-NR radio-frequency signal (EN-DC). In radio-frequency circuit 1, a radio-frequency signal transferred in transfer circuit 10 is used in 4G and a radio-frequency signal transferred in transfer circuit 20 is used in 5G, for example. The following can be given as examples of a first communication band/third communication band combination: (1) B1 and n77 as described in the embodiment, (2) B3 and n77, and the like.

In the case of employing the aforementioned combination (1), owing to the fact that a frequency, which is twice the first frequency f1 included in B1, is included in the frequency range of n77, a frequency (f2-f1) of second-order intermodulation distortion IMD2 is included in the transmission band of B1. With radio-frequency circuit 1 according to this embodiment, it is possible to effectively reduce the in-band (B1) spurious emission in 3GPP or the deterioration of reception sensitivity to B1 signals.

In the case of employing the aforementioned combination (2), owing to the fact that a frequency, which is twice the first frequency f1 included in B3, is included in the frequency range of n77, a frequency (f2-f1) of second-order intermodulation distortion IMD2 is included in the reception band of B3. With radio-frequency circuit 1 according to this embodiment, it is possible to effectively reduce the deterioration of reception sensitivity to B3 signals.

Furthermore, the first communication band/third communication band combination employed by radio-frequency circuit 1 and communication device 6 according to this embodiment is not limited to the aforementioned combination (1) or (2), and any of the combinations shown in Table 1 can be employed as well.

In radio-frequency circuit 1 according to this embodiment, a radio-frequency signal transferred in transfer circuit 10 may be used in 4G or 5G, and a radio-frequency signal transferred in transfer circuit 20 may be used in a wireless local area network (WLAN) using a frequency band of at least 5 GHz, for example.

As a first example of application in this case, filter 11B is a filter having, as a passband, a frequency range from 2.5 GHz to 4.2 GHz. Each of duplexers 13 and 14 is defined to have, as a passband, any one of B41, n41, B42, B48, n77, and n78. Filter 21A is a filter having, as a passband, a frequency range from 5.925 GHz to 7.125 GHz, and filter 21B is a filter having, as a passband, a frequency range from 5.15 GHz to 5.925 GHz.

As a second example of application in this case, filter 11B is a filter having, as a passband, the frequency range from 2.5 GHz to 4.2 GHz. Each of duplexers 13 and 14 is defined to have, as a passband, any one of B41, n41, B42, B48, n77, and n78. Filter 21A is a filter having, as a passband, a frequency range from 5.47 GHz to 5.925 GHz, and filter 21B is a filter having, as a passband, a frequency range from 5.15 GHz to 5.35 GHz.

As a third example of application in this case, filter 11B is a filter having, as a passband, a frequency range from 2.5 GHz to 4.2 GHz. Duplexer 14 has, as a passband, a frequency range (the first communication band) that includes at least one of n77 or n78 and is included in the frequency range from 2.5 GHz to 4.2 GHz. Filter 21 A has, as a passband, a frequency range (the second communication band) that is different from the first communication band and is included in the frequency range from 2.5 GHz to 4.2 GHz. Filter 21B has, as a passband, a frequency range (the third communication band) with a lower limit of 5 GHz.

Table 1 also shows the first communication band/third communication band combinations in the aforementioned first through third application examples.

As shown in Table 1, with radio-frequency circuit 1 and communication device 6 according to this embodiment, it is possible to effectively reduce, besides second-order intermodulation distortion IMD2 generated when radio-frequency signals of 4G, 5G, and WLAN are simultaneously transmitted, in-band spurious emission due to third-order intermodulation distortion IMD 3 or the deterioration of reception sensitivity.

2. Configuration of Radio-Frequency Circuit 1A According to Variation 2

Figure 3:
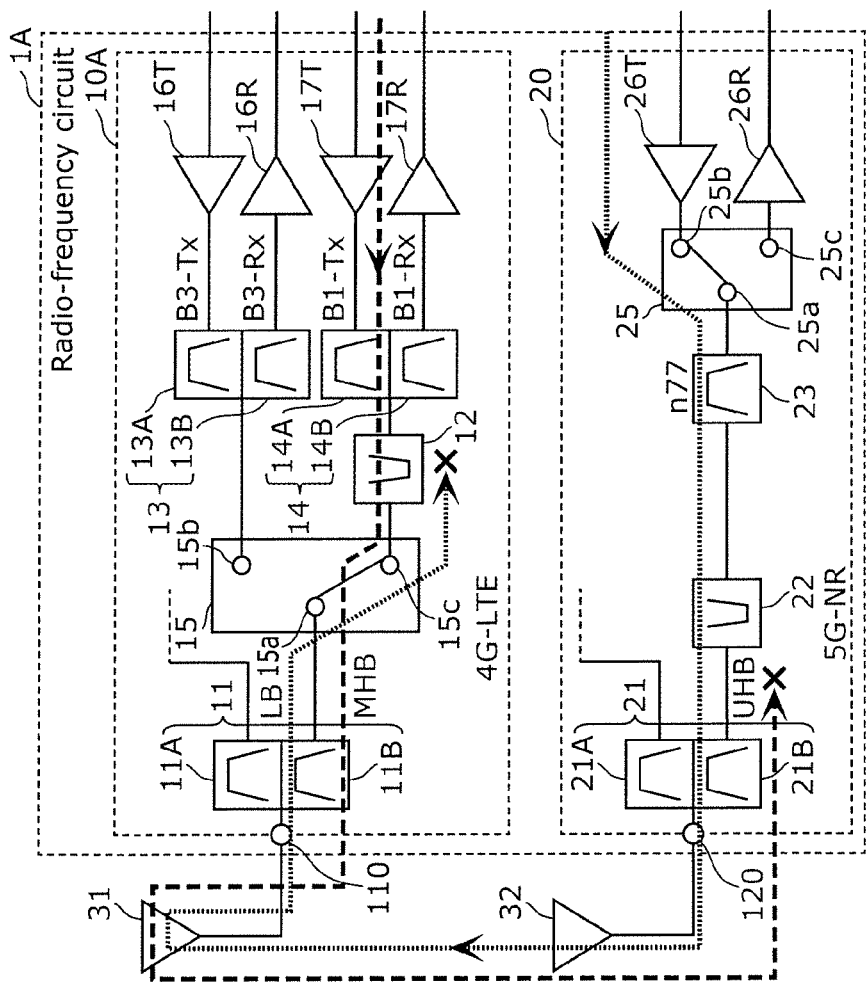
FIG. 3 is a circuit configuration diagram of a radio-frequency circuit according to Variation 2 of the embodiment.

FIG. 3 is a circuit configuration diagram of radio-frequency circuit 1A according to Variation 2 of the embodiment in FIG. 1A. As illustrated in FIG. 3, radio-frequency circuit 1A includes transfer circuit 10A and transfer circuit 20. Radio-frequency circuit 1A according to Variation 2 has band-elimination filter 12 disposed in a different location in transfer circuit 10A, compared with radio-frequency circuit 1 according to the embodiment. Hereinafter, elements of radio-frequency circuit 1A according to Variation 2 which are the same as those in radio-frequency circuit 1 according to the embodiment will be omitted, and description will be centered on those elements that are different.

Transfer circuit 10A, like transfer circuit 10, includes antenna connector terminal 110, diplexer 11, band-elimination filter 12, duplexers 13 and 14, switch 15, power amplifiers 16T and 17T, and low-noise amplifiers 16R and 17R.

Duplexer 14 is one example of the first duplexer and includes transmission filter 14A and reception filter 14B. The output terminal of transmission filter 14A and the input terminal of reception filter 14B are commonly connected to one terminal of band-elimination filter 12.

Duplexer 13 is one example of the second duplexer and includes transmission filter 13A and reception filter 13B. The output terminal of transmission filter 13A and the input

TABLE 1

|  | First communication band (Tx1, Rx1) | Third communication band (Tx2, Rx2) | IMD2 Tx2-Tx1 (MHz) | IMD3 2Tx2-Tx1 (MHz) | Band overlapped by IMD |
|---|---|---|---|---|---|
| Ex. 1 | B1 | n77 | yes |  | B1-Tx |
| Ex. 2 | B2 | B(n)66 |  | yes | B(n)66-Tx |
| Ex. 3 | B2 | n78 | yes |  | B2-Tx |
| Ex. 4 | B3 | n77 | yes |  | B3-Tx |
| Ex. 5 | B3 | n78 | yes |  | B3-Tx |
| Ex. 6 | B8 | n78 | yes |  | n78 |
| Ex. 7 | B18 | n77 | yes |  | n77 |
| Ex. 8 | B19 | n77 | yes |  | n77 |
| Ex. 9 | B20 | n8 |  | yes | B20-TX n8-Tx |
| Ex. 10 | B20 | n77 | yes |  | n77 |
| Ex. 11 | B26 | n77 | yes |  | n77 |
| Ex. 12 | B28 | n51 | yes |  | B28-TX |
| Ex. 13 | B28 | n77 | yes |  | n77 |
| Ex. 14 | B39 | n78 | yes |  | B39 |
| Ex. 15 | B41 | n79 | yes |  | B41-TX |
| Ex. 16 | B66 | n78 | yes |  | B66-TX |
| Ex. 17 | n77 3.3-4.2 GHz | WLAN 6.525-7.125 GHz | yes |  | n77 3.3-4.2 GHz |
| Ex. 18 | n78 3.3-3.8 GHz | WLAN 6.6-7.125 GHz | yes |  | n78 3.3-3.8 GHz |
| Ex. 19 | B41(n41) 2.5-2.69 GHz | WLAN 5.15-5.35 GHz | yes |  | B41(n41) 2.5-2.69 GHz |
| Ex. 20 | B42 3.4-3.6 GHz | WLAN 6.525-7.125 GHz | yes |  | B42 3.4-3.6 GHz |
| Ex. 21 | B48 3.55-3.7 GHz | WLAN 6.875-7.125 GHz | yes |  | B48 3.55-3.7 GHz | terminal of reception filter 13B are commonly connected to selector terminal 15b of switch 15.

Band-elimination filter 12 is one example of the first band-elimination filter, is disposed between selector terminal 15c of switch 15 and duplexer 14, and has, as an attenuation band, a band of n77 (the third communication band) in the ultra-high band group for radio-frequency signals transferred by transfer circuit 20.

Switch 15 is one example of the first switch, is disposed between diplexer 11 and band-elimination filter 12 and duplexer 13, and switches connection of diplexer 11 between band-elimination filter 12 and duplexer 13. Specifically, switch 15 is, for example, an SPDT switch circuit including common terminal 15a and selector terminals 15b and 15c. Common terminal 15a is connected to the other terminal of filter 11B, selector terminal 15b is connected to the common terminal of duplexer 13 (the output terminal of transmission filter 13A and the input terminal of reception filter 13B), and selector terminal 15c is connected to the other terminal of band-elimination filter 12.

In other words, band-elimination filter 12 is connected to the output terminal of transmission filter 14A, and switch 15 is disposed between diplexer 11 and band-elimination filter 12 and transmission filter 13A.

With the configuration of radio-frequency circuit 1A according to this Variation 2, it is possible to block an n77 transmission signal flowing into transfer circuit 10A via antenna connector terminal 110, before the n77 transmission signal reaches duplexer 14. It is therefore possible to reduce an increase, due to non-linear behavior exhibited by duplexer 14, in the intermodulation distortion between the n77 transmission signal and a B1 transmission signal. Accordingly, it is possible to effectively reduce the in-band spurious emission in 3GPP or the deterioration of reception sensitivity to n77 signals.

3. Configuration of Radio-Frequency Circuit 1B and Communication Device 6B According to Variation 3

Figure 4:
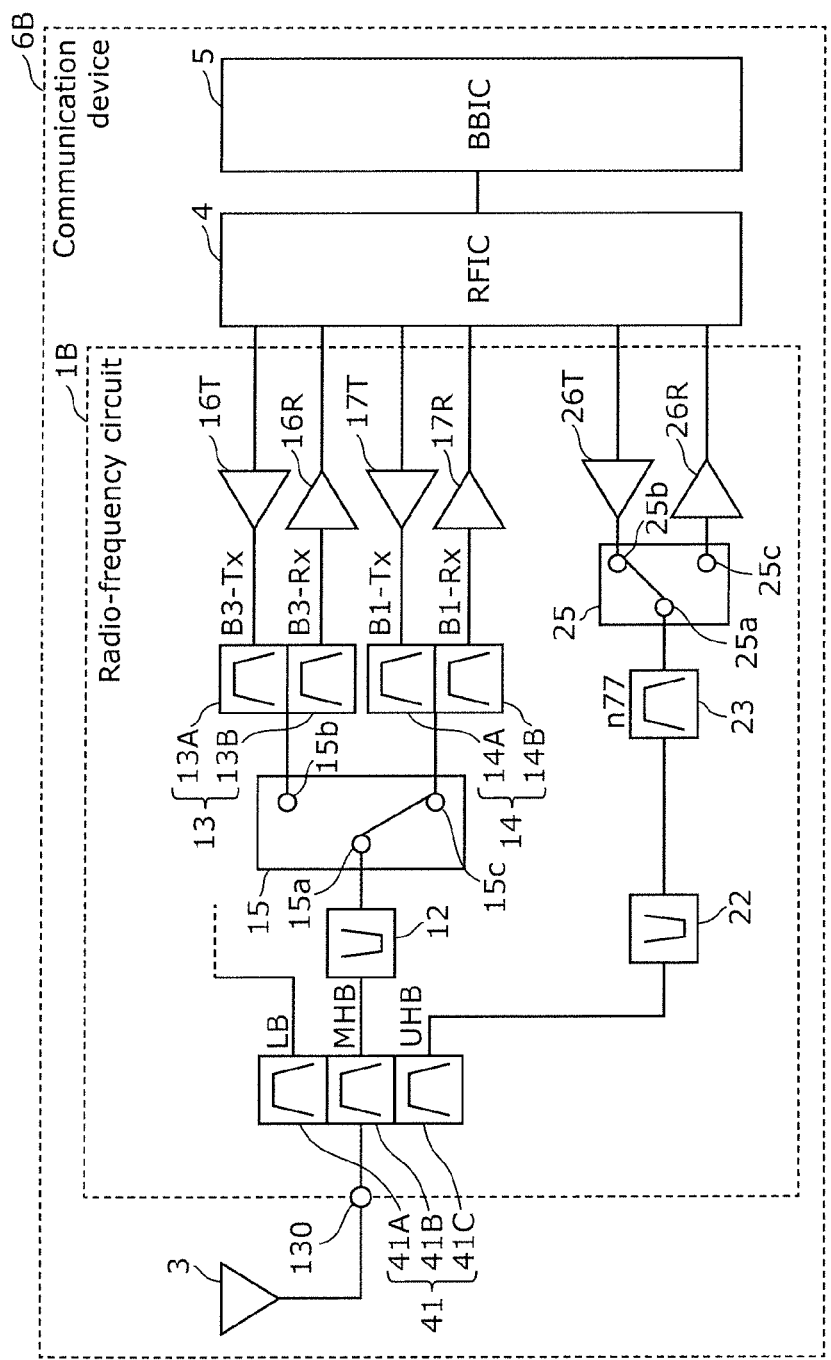
FIG. 4 is a circuit configuration diagram of a radio-frequency circuit and a communication device according to Variation 3 of the embodiment.

FIG. 4 is a circuit configuration diagram of radio-frequency circuit 1B and communication device 6B according to Variation 3 of the embodiment. As illustrated in FIG. 4, communication device 6B includes radio-frequency circuit 1B, antenna 3, RFIC 4, and BBIC 5. Communication device 6B according to this variation has different elements that are antenna 3 and radio-frequency circuit 1B, as compared with communication device 6 according to the embodiment. More specifically, radio-frequency circuit 1B is connected to single antenna 3 via antenna connector terminal 130. Radio-frequency circuit 1B according to this Variation 3 is different from radio-frequency circuit 1 according to the embodiment in FIG. 1A in that transfer circuits 10 and 20 are consolidated into a single transfer circuit. Hereinafter, elements of radio-frequency circuit 1B according to Variation 3 which are the same as those in radio-frequency circuit 1 according to the embodiment in FIG. 1A will be omitted, and description will be centered on those elements that are different.

Radio-frequency circuit 1B includes antenna connector terminal 130, triplexer 41, band-elimination filters 12 and 22, duplexers 13 and 14, filter 23, switches 15 and 25, power amplifiers 16T, 17T, and 26T, and low-noise amplifiers 16R, 17R, and 26R.

Band-elimination filter 12, duplexers 13 and 14, switch 15, power amplifiers 16T and 17T, low-noise amplifiers 16R and 17R are configured in the same manner as those included in transfer circuit 10 in radio-frequency circuit 1 according to the embodiment.

Band-elimination filter 22, filter 23, switch 25, power amplifier 26T, and low-noise amplifier 26R are configured in the same manner as those included in transfer circuit 20 in radio-frequency circuit 1 according to the embodiment.

Antenna connector terminal 130 is one example of the first antenna connector terminal and the second antenna connector terminal, and is connected to antenna 3 (the first antenna and second antenna).

Triplexer 41 is one example of the first multiplexer and the second multiplexer, is connected to antenna connector terminal 130, and demultiplexes and/or multiplexes a radio-frequency signal of a low band group (LB), a radio-frequency signal of a middle high band group (MHB), and a radio-frequency signal of an ultra-high band group (UHB). Triplexer 41 includes filters 41A, 41B, and 41C. Filter 41A is a filter having, as a passband, the frequency range of the low band group (LB), filter 41B is a filter having, as a passband, the frequency range of the middle high band group (MHB), and filter 41C is a filter having, as a passband, the frequency range of the ultra-high band group (UHB). One terminal of filter 41A, one terminal of filter 41B, and one terminal of filter 41C are commonly connected to antenna connector terminal 130.

The other terminal of filter 41B is connected to band-elimination filter 12. The other terminal of filter 41C is connected to band-elimination filter 22.

According to the aforementioned configuration, radio-frequency circuit 1B is capable of simultaneously transmitting a radio-frequency signal of the middle high band group including B1 and B3, and a radio-frequency signal of the ultra-high band group including n77.

As is the case of communication device 6B according to this Variation 3, when radio-frequency circuit 1B is connected to the same, single antenna 3, the intensity of an unwanted wave that is intermodulation distortion (reverse IMD) generated via antenna 3 increases, compared with a communication device having a plurality of antennas. With the aforementioned configuration, even when two transfer circuits performing simultaneous transmission are commonly connected to single antenna 3, it is possible to provide communication device 6B that satisfies the in-band spurious emission specification in 3GPP and reduces the deterioration of reception sensitivity.

Note that antenna connector terminal 130, triplexer 41, band-elimination filters 12 and 22, duplexers 13 and 14, filter 23, switches 15 and 25, power amplifiers 16T, 17T, and 26T as well as low-noise amplifiers 16R, 17R, and 26R, which are included in radio-frequency circuit 1B, may be formed in a single mounting substrate.

Communication device 6B may be replaced by a communication device including radio-frequency circuit 1 according to the embodiment in FIG. 1 and antenna 3 commonly connected to both antenna connector terminals 110 and 120. Even with such a communication device, the same advantageous effects as attained by communication device 6B are produced.

As described above, radio-frequency circuit 1 according to the embodiment in FIG. 1 is capable of simultaneously transmitting a radio-frequency signal of a first frequency band group (e.g., middle high band group) including a first communication band (e.g., B1) and a second communication band (e.g., B3), and a radio-frequency signal of a second frequency band (e.g., ultra-high band group) including a third communication band (e.g., n77) and having a frequency range that does not overlap the frequency range of the first frequency band group. Radio-frequency circuit 1 includes: transfer circuit 10 configured to transfer the radio-frequency signal of the first frequency band group and a radio-frequency signal of a third frequency band group (e.g.

a low band group) having a frequency range that does not overlap the frequency range of the first frequency band group; and transfer circuit 20 configured to transfer the radio-frequency signal of the second frequency band group. Transfer circuit 10 includes: antenna connector terminal 110; power amplifier 17T configured to amplify a radio-frequency signal of the first communication band; diplexer 11 that is connected to antenna connector terminal 110 and is configured to demultiplex and/or multiplex the radio-frequency signal of the first frequency band group and the radio-frequency signal of the third frequency band group; transmission filter 14A that is connected to an output terminal of power amplifier 17T and has, as a passband, a transmission band of the first communication band; and band-elimination filter 12 that is disposed between diplexer 11 and transmission filter 14A and has, as an attenuation band, a transmission band of the third communication band. Transfer circuit 20 includes power amplifier 26T configured to amplify a radio-frequency signal of the third communication band.

According to this, with band-elimination filter 12 disposed between diplexer 11 and transmission filter 14A, it is possible to inhibit a transmission signal of the third communication band, which is output from transfer circuit 20, from reaching transmission filter 14A via antenna connector terminal 110. This can prevent the in-band spurious emission specification in 3GPP from being unsatisfied due to the generation, in the transmission band of the first communication band, of an unwanted wave that is intermodulation distortion (reverse IMD) between the transmission signal of the third communication band, which flows in from transfer circuit 20 via antenna connector terminal 110, and the transmission signal of the first communication band, which is transferred in transfer circuit 10. Moreover, it is possible to reduce the deterioration of reception sensitivity to signals of the first communication band, which is caused by the generation of the unwanted wave in the reception band of the first communication band.

Moreover, it is possible to block a transmission signal of the third communication band, which flows into transfer circuit 10 via antenna connector terminal 110, before the transmission signal reaches transmission filter 14A, as compared with the case where band-elimination filter 12 is disposed between transmission filter 14A and power amplifier 17T. It is therefore possible to reduce an increase, due to non-linear behavior exhibited by transmission filter 14A, in the intermodulation distortion between the transmission signal of the third communication band and the transmission signal of the first communication band. Accordingly, it is possible to effectively reduce the in-band spurious emission in 3GPP or the deterioration of reception sensitivity to signals of the first communication band.

Transfer circuit 10 may further include: transmission filter 13A that has, as a passband, a transmission band of the second communication band; and switch 15 that is disposed between (i) band-elimination filter 12 and (ii) transmission filter 13A and transmission filter 14A, and is configured to switch connection of band-elimination filter 12 between transmission filter 13A and transmission filter 14A.

According to this configuration, it is possible to block a transmission signal of the third communication band, which flows into transfer circuit 10 via antenna connector terminal 110, before the transmission signal reaches switch 15. It is therefore possible to reduce an increase, due to non-linear behavior exhibited by switch 15, in the intermodulation distortion between the transmission signal of the third communication band and the transmission signal of the first communication band. Accordingly, it is possible to effectively reduce the in-band spurious emission in 3GPP or the deterioration of reception sensitivity to signals of the first communication band.

Transfer circuit 10 may further include: reception filter 14B that has, as a passband, a reception band of the first communication band; and reception filter 13B that has, as a passband, a reception band of the second communication band. Transmission filter 14A and reception filter 14B may constitute duplexer 14. Transmission filter 13A and reception filter 13B may constitute duplexer 13. Switch 15 may be configured to switch connection of band-elimination filter 12 between duplexer 13 and duplexer 14.

According to this configuration, it is possible to block a transmission signal of the third communication band, which flows into transfer circuit 10 via antenna connector terminal 110, before the transmission signal reaches switch 15 and duplexer 14. It is therefore possible to reduce an increase, due to non-linear behavior exhibited by switch 15 and duplexer 14, in the intermodulation distortion between the transmission signal of the third communication band and the transmission signal of the first communication band. Moreover, it is possible to block a transmission signal of the third communication band, which flows into transfer circuit 10 via antenna connector terminal 110, before the transmission signal reaches switch 15 and duplexer 13. It is therefore possible to reduce an increase, due to non-linear behavior exhibited by switch 15 and duplexer 13, in intermodulation distortion between the transmission signal of the third communication band and the transmission signal of the second communication band. Accordingly, it is possible to effectively reduce the in-band spurious emission in 3GPP or the deterioration of reception sensitivity to signals of the first communication band or the second communication band.

Band-elimination filter 12 may be connected to an output terminal of transmission filter 14A. Transfer circuit 10 may further include: transmission filter 13A that has, as a passband, a transmission band of the second communication band; and switch 15 that is disposed between (i) diplexer 11 and (ii) band-elimination filter 12 and transmission filter 13A, and is configured to switch connection of diplexer 11 between band-elimination filter 12 and transmission filter 13A.

According to this configuration, it is possible to block a transmission signal of the third communication band, which flows into transfer circuit 10 via antenna connector terminal 110, before the transmission signal reaches transmission filter 14A. It is therefore possible to reduce an increase, due to non-linear behavior exhibited by transmission filter 14A, in the intermodulation distortion between the transmission signal of the third communication band and the transmission signal of the first communication band. Accordingly, it is possible to effectively reduce the in-band spurious emission in 3GPP or the deterioration of reception sensitivity to signals of the first communication band.

Transfer circuit 20 may further include: antenna connector terminal 120; diplexer 21 that is connected to antenna connector terminal 120 and configured to demultiplex and/or multiplex the radio-frequency signal of the second frequency band group and a radio-frequency signal of a fourth frequency band group having a frequency range that does not overlap the frequency range of the second frequency band group; filter 23 configured to pass the radio-frequency signal of the third communication band, the radio-frequency signal being output from transmission power amplifier 26T; and band-elimination filter 22 that is disposed between diplexer 21 and filter 23, and has, as an attenuation band, the transmission band of the first communication band.

According to this configuration, with band-elimination filter 22 disposed between diplexer 21 and filter 23, it is possible to inhibit a transmission signal of the first communication band, which is output from transfer circuit 10, from reaching filter 23 via antenna connector terminal 120. This can avoid the in-band spurious emission specification in 3GPP being unsatisfied due to the generation, by non-linear behavior exhibited by transfer circuit 20, of a harmonic of the transmission signal of the first communication band, owing to the transmission signal of the first communication band being transferred via antenna 32. Moreover, it is possible to avoid the deterioration of reception sensitivity to signals of the third communication band, which is caused by the generation of the harmonic in the reception band of the third communication band.

Moreover, it is possible to block a transmission signal of the first communication band, which flows into transfer circuit 20 via antenna connector terminal 120, before the transmission signal reaches filter 23, as compared with the case where band-elimination filter 22 is disposed between filter 23 and power amplifier 26T. It is therefore possible to reduce an increase, due to non-linear behavior exhibited by transfer circuit 20, of the harmonic in the first communication band. Accordingly, it is possible to effectively reduce the in-band spurious emission in 3GPP or the deterioration of reception sensitivity to signals of the third communication band.

Moreover, a frequency that is twice a first frequency included in the first communication band may be included in the third communication band.

This can avoid the in-band spurious emission specification in 3GPP being unsatisfied due to the generation, in the transmission band of the first communication band, of an unwanted wave that is second-order intermodulation distortion between a transmission signal of the third communication band, which is output from transfer circuit 20, and a transmission signal of the first communication band, which is transferred in transfer circuit 10. Moreover, it is possible to avoid the deterioration of reception sensitivity to signals of the first communication band, which is caused by the generation of the unwanted wave in the reception band of the first communication band.

Moreover, the first communication band may be at least one of B1, B2, B3, B8, B18, B19, B20, B26, B28, B39, B41, or B66 of the 4G-LTE, the second communication band may be different from the first communication band and is at least one of B1, B2, B3, B8, B18, B19, B20, B26, B28, B39, B41, or B66 of the 4G-LTE, and the third communication band may be at least one of n77, n78, or n79 of the 5G-NR.

The radio-frequency signal transferred in transfer circuit 10 may be used in the 4G and the radio-frequency signal transferred in transfer circuit 20 may be used in the 5G.

This can effectively reduce the in-band spurious emission in 3GPP or the deterioration of reception sensitivity in EN-DC that allows simultaneous transmission of a 4G radio-frequency signal and a 5G radio-frequency signal.

The radio-frequency signal transferred in transfer circuit 10 may be used in one of the 4G and the 5G, and the radio-frequency signal transferred in transfer circuit 20 may be used in a WLAN using a frequency band of at least 5 GHz.

The first communication band may include at least one of n77 or n78 of the 5G-NR and have a frequency range included in a range of from 2.5 GHz to 4.2 GHz. The second communication band may be different from the first communication band and have a frequency range included in the range of from 2.5 GHz to 4.2 GHz. The third communication band may have a frequency range with a lower limit of 5 GHz.

Communication device 6 according to this embodiment includes transfer circuit 10, transfer circuit 20, antenna 31 connected to transfer circuit 10, antenna 32 connected to transfer circuit 20, and RFIC 4 configured to process a radio-frequency signal transmitted or received by antenna 31 via transfer circuit 10 and a radio-frequency signal transmitted or received by antenna 32 via transfer circuit 20.

This makes it possible to provide communication device 6 that satisfies the in-band spurious emission specification in 3GPP and reduces the deterioration of reception sensitivity.

Antenna 31 and antenna 32 may be configured as single antenna 3.

When transfer circuits 10 and 20 are connected to single antenna 3, the intensity of an unwanted wave that is intermodulation distortion (reverse IMD) generated via antenna 3 increases. With the aforementioned configuration, even when transfer circuits 10 and 20 are commonly connected to single antenna 3, it is possible to provide communication device 6B that satisfies the in-band spurious emission specification in 3GPP and reduces the deterioration of reception sensitivity.

OTHER EMBODIMENTS

Although the radio-frequency circuit and the communication device according to the present disclosure have been described above based on an exemplary embodiment and variations thereof, the radio-frequency circuit and the communication device according to the present disclosure are not limited to the foregoing embodiment and variations thereof. The present invention also encompasses other embodiments achieved by combining arbitrary elements in the above embodiment and variations thereof, variations resulting from various modifications to the embodiment and variations thereof that may be conceived by those skilled in the art without departing from the essence of the present disclosure, and various devices that include the radio-frequency circuit and the communication device according to the embodiment and variations thereof.

For example, in the radio-frequency circuit and the communication device according to each of the foregoing embodiment and variations thereof, another radio-frequency circuit element or wire may be inserted between a circuit element and a signal path or between signal paths, or in a path connecting circuit elements in each of the circuit configuration diagrams disclosed.

The radio-frequency circuit according to the present disclosure may include only transfer circuit 10 out of transfer circuit 10 and transfer circuit 20 included in radio-frequency circuit 1 according to the embodiment. Namely, the radio-frequency circuit according to the present disclosure may be configured to transfer (i) a radio-frequency signal of a first frequency band group including a first communication band and a second communication band, and (ii) a radio-frequency signal of a third frequency band group having a frequency range that does not overlap the frequency range of the first frequency band group, and may include: an antenna connector terminal; a first transmission power amplifier configured to amplify a radio-frequency signal of the first communication band; a first multiplexer that is connected to the first antenna connector terminal and configured to demultiplex and/or multiplex the radio-frequency signal of the first frequency band group and the radio-frequency signal of the third frequency band group; a first transmission filter that is connected to an output terminal of the first transmission power amplifier and has, as a passband, a transmission band of the first communication band; and a first band-elimination filter that is disposed between the first multiplexer and the first transmission filter, and has, as an attenuation band, a predetermined frequency band. A frequency of an unwanted wave may be included in the transmission band of the first communication band, the unwanted wave being intermodulation distortion between a radio-frequency signal of the transmission band of the first communication band and a radio-frequency signal of the predetermined frequency band.

According to this configuration, it is possible, with the first band-elimination filter disposed between the first multiplexer and the first transmission filter, to inhibit a signal of the predetermined frequency band, which flows in from outside, from reaching the first transmission filter via the antenna connector terminal. This can avoid the in-band spurious emission specification in 3GPP being unsatisfied due to the generation, in the transmission band of the first communication band, of an unwanted wave that is intermodulation distortion between the signal of the predetermined frequency band and a transmission signal of the first communication band, which is transferred in the radio-frequency circuit. Moreover, it is possible to avoid the deterioration of reception sensitivity to signals of the first communication band, which is caused by the generation of the unwanted wave in the reception band of the first communication band.

Moreover, it is possible to block a signal of the predetermined frequency band flowing into the radio-frequency circuit via the antenna connector terminal, before the signal reaches the first transmission filter, as compared with the case where the first band-elimination filter is disposed between the first transmission filter and the first transmission power amplifier. It is therefore possible to reduce an increase, due to non-linear behavior exhibited by the first transmission filter, in the intermodulation distortion between the signal of the predetermined frequency band and the transmission signal of the first communication band. Accordingly, it is possible to effectively reduce the in-band spurious emission in 3GPP or the deterioration of reception sensitivity to signals of the first communication band.

Furthermore, the controller according to the present disclosure may be realized as an integrated circuit (IC) or large scale integration (LSI). The method of implementation of structural elements using an integrated circuit may be realized using a dedicated circuit or a general-purpose processor. A field programmable gate array (FPGA) that allows for programming after the manufacture of an LSI, or a reconfigurable processor that allows for reconfiguration of the connection and the setting of circuit cells inside an LSI may be employed. When circuit integration technology that replaces LSIs comes along owing to advances of the semiconductor technology or to a separate derivative technology, the function blocks may understandably be integrated using that technology.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as a mobile phone, as a radio-frequency circuit and a communication device that simultaneously transmit two or more radio-frequency signals having frequencies that do not overlap each other.

What is claimed is:

1. A radio-frequency circuit capable of simultaneously transmitting (i) a radio-frequency signal of a first frequency band group including a first communication band and a second communication band and (ii) a radio-frequency signal of a second frequency band group including a third communication band and having a frequency range that does not overlap a frequency range of the first frequency band group, the radio-frequency circuit comprising:
 a first transfer circuit configured to transfer the radio-frequency signal of the first frequency band group and a radio-frequency signal of a third frequency band group having a frequency range that does not overlap the frequency range of the first frequency band group; and
 a second transfer circuit configured to transfer the radio-frequency signal of the second frequency band group,
 wherein the first transfer circuit includes:
  a first antenna connector terminal;
  a first transmission power amplifier configured to amplify a radio-frequency signal of the first communication band;
  a first multiplexer that is connected to the first antenna connector terminal and is configured to demultiplex and/or multiplex the radio-frequency signal of the first frequency band group and the radio-frequency signal of the third frequency band group;
  a first transmission filter that is connected to an output terminal of the first transmission power amplifier and has, as a passband, a transmission band of the first communication band; and
  a first band-elimination filter that is disposed between the first multiplexer and the first transmission filter, and has, as an attenuation band, a transmission band of the third communication band,
  a second transmission filter that has, as a passband, a transmission band of the second communication band; and
  a first switch that is disposed between (i) the first band-elimination filter and (ii) the first transmission filter and the second transmission filter, and is configured to switch connection of the first band-elimination filter between the first transmission filter and the second transmission filter, and
 wherein the second transfer circuit includes:
  a second transmission power amplifier configured to amplify a radio-frequency signal of the third communication band.

2. The radio-frequency circuit according to claim 1, wherein
 the first transfer circuit further includes:
  a first reception filter that has, as a passband, a reception band of the first communication band; and
  a second reception filter that has, as a passband, a reception band of the second communication band,
  the first transmission filter and the first reception filter constitute a first duplexer,
  the second transmission filter and the second reception filter constitute a second duplexer, and the first switch is configured to switch connection of the first band-elimination filter between the first duplexer and the second duplexer.

3. The radio-frequency circuit according to claim 1, wherein
a frequency that is twice a first frequency included in the first communication band is included in the third communication band.

4. The radio-frequency circuit according to claim 3, wherein
the first communication band is at least one of B1, B2, B3, B8, B18, B19, B20, B26, B28, B39, B41, or B66 of a fourth generation mobile communication system (4G)-long term evolution (LTE),
the second communication band is different from the first communication band and is at least one of the B1, B2, B3, B8, B18, B19, B20, B26, B28, B39, B41, or B66 of 4G-LTE, and
the third communication band is at least one of n77, n78, or n79 of a fifth generation mobile communication system (5G)-new radio (NR).

5. The radio-frequency circuit according to claim 1, wherein
the radio-frequency signal transferred in the first transfer circuit is used in a fourth generation mobile communication system (4G), and
the radio-frequency signal transferred in the second transfer circuit is used in a fifth generation mobile communication system (5G).

6. The radio-frequency circuit according to claim 1, wherein
the radio-frequency signal transferred in the first transfer circuit is used in one of a fourth generation mobile communication system (4G) and a fifth generation mobile communication system (5G), and
the radio-frequency signal transferred in the second transfer circuit is used in a wireless local area network (WLAN) using a frequency band of at least 5 GHz.

7. The radio-frequency circuit according to claim 6, wherein
the first communication band includes at least one of 5G-new radio (NR) n77 or n78 and has a frequency range included in a range of from 2.5 GHz to 4.2 GHz,
the second communication band is different from the first communication band and has a frequency range included in the range of from 2.5 GHz to 4.2 GHz, and
the third communication band has a frequency range with a lower limit of 5 GHz.

8. A communication device, comprising:
the radio-frequency circuit according to claim 1, the radio-frequency circuit comprising the first transfer circuit and the second transfer circuit;
a first antenna connected to the first transfer circuit;
a second antenna connected to the second transfer circuit; and
an RF signal processing circuit configured to process a radio-frequency signal transmitted or received by the first antenna via the first transfer circuit and a radio-frequency signal transmitted or received by the second antenna via the second transfer circuit.

9. The communication device according to claim 8, wherein
the first antenna and the second antenna are configured as a single antenna.

10. A radio-frequency circuit capable of simultaneously transmitting (i) a radio-frequency signal of a first frequency band group including a first communication band and a second communication band and (ii) a radio-frequency signal of a second frequency band group including a third communication band and having a frequency range that does not overlap a frequency range of the first frequency band group, the radio-frequency circuit comprising:
a first transfer circuit configured to transfer the radio-frequency signal of the first frequency band group and a radio-frequency signal of a third frequency band group having a frequency range that does not overlap the frequency range of the first frequency band group; and
a second transfer circuit configured to transfer the radio-frequency signal of the second frequency band group,
wherein the first transfer circuit includes:
a first antenna connector terminal;
a first transmission power amplifier configured to amplify a radio-frequency signal of the first communication band;
a first multiplexer that is connected to the first antenna connector terminal and is configured to demultiplex and/or multiplex the radio-frequency signal of the first frequency band group and the radio-frequency signal of the third frequency band group;
a first transmission filter that is connected to an output terminal of the first transmission power amplifier and has, as a passband, a transmission band of the first communication band; and
a first band-elimination filter that is disposed between the first multiplexer and the first transmission filter, and has, as an attenuation band, a transmission band of the third communication band, wherein the first band-elimination filter is connected to an output terminal of the first transmission filter,
a second transmission filter that has, as a passband, a transmission band of the second communication band; and
a first switch that is disposed between (i) the first multiplexer and (ii) the first band-elimination filter and the second transmission filter, and is configured to switch connection of the first multiplexer between the first band-elimination filter and the second transmission filter,
wherein the second transfer circuit includes:
a second transmission power amplifier configured to amplify a radio-frequency signal of the third communication band.

11. A radio-frequency circuit capable of simultaneously transmitting (i) a radio-frequency signal of a first frequency band group including a first communication band and a second communication band and (ii) a radio-frequency signal of a second frequency band group including a third communication band and having a frequency range that does not overlap a frequency range of the first frequency band group, the radio-frequency circuit comprising:
a first transfer circuit configured to transfer the radio-frequency signal of the first frequency band group and a radio-frequency signal of a third frequency band group having a frequency range that does not overlap the frequency range of the first frequency band group; and
a second transfer circuit configured to transfer the radio-frequency signal of the second frequency band group,
wherein the first transfer circuit includes:
a first antenna connector terminal;
a first transmission power amplifier configured to amplify a radio-frequency signal of the first communication band;

a first multiplexer that is connected to the first antenna connector terminal and is configured to demultiplex and/or multiplex the radio-frequency signal of the first frequency band group and the radio-frequency signal of the third frequency band group;
a first transmission filter that is connected to an output terminal of the first transmission power amplifier and has, as a passband, a transmission band of the first communication band; and
a first band-elimination filter that is disposed between the first multiplexer and the first transmission filter, and has, as an attenuation band, a transmission band of the third communication band, wherein
the second transfer circuit further includes:
a second antenna connector terminal;
a second multiplexer that is connected to the second antenna connector terminal and is configured to demultiplex and/or multiplex the radio-frequency signal of the second frequency band group and a radio-frequency signal of a fourth frequency band group having a frequency range that does not overlap the frequency range of the second frequency band group;
a third transmission filter configured to pass the radio-frequency signal of the third communication band, the radio-frequency signal being output from the second transmission power amplifier; and
a second band-elimination filter that is disposed between the second multiplexer and the third transmission filter, and has, as an attenuation band, the transmission band of the first communication band.

12. A radio-frequency circuit that transfers (i) a radio-frequency signal of a first frequency band group including a first communication band and a second communication band, and (ii) a radio-frequency signal of a third frequency band group having a frequency range that does not overlap a frequency range of the first frequency band group, the radio-frequency circuit comprising:
an antenna connector terminal;
a first transmission power amplifier configured to amplify a radio-frequency signal of the first communication band;
a first multiplexer that is connected to the first antenna connector terminal and configured to demultiplex and/or multiplex the radio-frequency signal of the first frequency band group and the radio-frequency signal of the third frequency band group;
a first transmission filter that is connected to an output terminal of the first transmission power amplifier and has, as a passband, a transmission band of the first communication band; and
a first band-elimination filter that is disposed between the first multiplexer and the first transmission filter, and has, as an attenuation band, a predetermined frequency band,
a second transmission filter that has, as a passband, a transmission band of the second communication band; and
a first switch that is disposed between (i) the first band-elimination filter and (ii) the first transmission filter and the second transmission filter, and is configured to switch connection of the first band-elimination filter between the first transmission filter and the second transmission filter, wherein
a frequency of an unwanted wave is included in the transmission band of the first communication band, the unwanted wave being intermodulation distortion between a radio-frequency signal of the transmission band of the first communication band and a radio-frequency signal of the predetermined frequency band.

13. A radio-frequency circuit that transfers (i) a radio-frequency signal of a first frequency band group including a first communication band and a second communication band, and (ii) a radio-frequency signal of a third frequency band group having a frequency range that does not overlap a frequency range of the first frequency band group, the radio-frequency circuit comprising:
an antenna connector terminal;
a first transmission power amplifier configured to amplify a radio-frequency signal of the first communication band;
a first multiplexer that is connected to the first antenna connector terminal and configured to demultiplex and/or multiplex the radio-frequency signal of the first frequency band group and the radio-frequency signal of the third frequency band group;
a first transmission filter that is connected to an output terminal of the first transmission power amplifier and has, as a passband, a transmission band of the first communication band; and
a first band-elimination filter that is disposed between the first multiplexer and the first transmission filter, and has, as an attenuation band, a predetermined frequency band,
a second transmission filter that has, as a passband, a transmission band of the second communication band; and
a first switch that is disposed between (i) the first multiplexer and (ii) the first band-elimination filter and the second transmission filter, and is configured to switch connection of the first multiplexer between the first band-elimination filter and the second transmission filter, wherein
a frequency of an unwanted wave is included in the transmission band of the first communication band, the unwanted wave being intermodulation distortion between a radio-frequency signal of the transmission band of the first communication band and a radio-frequency signal of the predetermined frequency band, and
the first band-elimination filter is connected to an output terminal of the first transmission filter.

14. A radio-frequency circuit that transfers (i) a radio-frequency signal of a first frequency band group including a first communication band and a second communication band, and (ii) a radio-frequency signal of a third frequency band group having a frequency range that does not overlap a frequency range of the first frequency band group, the radio-frequency circuit comprising:
an antenna connector terminal;
a first transmission power amplifier configured to amplify a radio-frequency signal of the first communication band;
a first multiplexer that is connected to the first antenna connector terminal and configured to demultiplex and/or multiplex the radio-frequency signal of the first frequency band group and the radio-frequency signal of the third frequency band group;
a first transmission filter that is connected to an output terminal of the first transmission power amplifier and has, as a passband, a transmission band of the first communication band; and a first band-elimination filter that is disposed between the first multiplexer and the first transmission filter, and has, as an attenuation band, a predetermined frequency band;

a second antenna connector terminal;

a second multiplexer that is connected to the second antenna connector terminal and is configured to demultiplex and/or multiplex the radio-frequency signal of the second frequency band group and a radio-frequency signal of a fourth frequency band group having a frequency range that does not overlap the frequency range of the second frequency band group;

a third transmission filter configured to pass the radio-frequency signal of the third communication band, the radio-frequency signal being output from the second transmission power amplifier; and a second band-elimination filter that is disposed between the second multiplexer and the third transmission filter, and has, as an attenuation band, the transmission band of the first communication band, wherein a frequency of an unwanted wave is included in the transmission band of the first communication band, the unwanted wave being intermodulation distortion between a radio-frequency signal of the transmission band of the first communication band and a radio-frequency signal of the predetermined frequency band.

* * * * *

UNITED STATES PATENT AND TRADEMARK OFFICE
CERTIFICATE OF CORRECTION

PATENT NO. : 11,496,162 B2
APPLICATION NO. : 17/012789
DATED : November 8, 2022
INVENTOR(S) : Hirotsugu Mori et al.

It is certified that error appears in the above-identified patent and that said Letters Patent is hereby corrected as shown below:

In the Specification

Column 5, Line 65, "filter" should be -- filter 23 --.

Column 7, Line 27, "15" should be -- 1S --.

Column 7, Line 47, "15" should be -- 1S --.

Signed and Sealed this
Twenty-ninth Day of August, 2023

Katherine Kelly Vidal
*Director of the United States Patent and Trademark Office*